United States Patent
Miles

(10) Patent No.: US 6,833,292 B2
(45) Date of Patent: Dec. 21, 2004

(54) REDUCING DOPANT LOSSES DURING ANNEALING PROCESSES

(75) Inventor: Donald S. Miles, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/404,704

(22) Filed: Mar. 31, 2003

(65) Prior Publication Data

US 2004/0188752 A1 Sep. 30, 2004

(51) Int. Cl.⁷ .............................................. H01L 29/788
(52) U.S. Cl. ...................... 438/142; 438/197; 438/301; 438/369; 438/517; 438/696; 257/316
(58) Field of Search .................. 438/142, 197, 438/301, 369, 370, 517, 530, 559, 696, 778, 787, 976; 257/316

(56) References Cited

U.S. PATENT DOCUMENTS

| | | | | |
|---|---|---|---|---|
| 5,612,239 A | * | 3/1997 | Lin et al. ..................... | 438/305 |
| 5,972,760 A | * | 10/1999 | Ju ............................... | 438/305 |
| 5,972,764 A | * | 10/1999 | Huang et al. ................ | 438/305 |
| 6,500,765 B2 | * | 12/2002 | Kao et al. .................... | 438/694 |
| 6,713,357 B1 | * | 3/2004 | Wang et al. ................. | 438/287 |

* cited by examiner

Primary Examiner—Nathan J. Flynn
Assistant Examiner—Remmon R. Fordé
(74) Attorney, Agent, or Firm—Yingsheng Tung; Wade James Brady, III; Frederick J. Telecky, Jr.

(57) ABSTRACT

A method of reducing dopant losses is provided. The method includes providing a transistor structure having a first region, implanting a dopant into the first region, depositing a control layer adjacent the first region, and performing a first annealing process on the transistor structure. The control layer is operable to prevent at least a portion of the dopant in the first region from diffusing out of the first region toward the control layer during the first annealing process.

6 Claims, 3 Drawing Sheets

REDUCING DOPANT LOSSES DURING ANNEALING PROCESSES

TECHNICAL FIELD OF THE INVENTION

This invention relates in general to annealing processes in semiconductor device fabrication, and, more particularly, to reducing dopant losses during annealing processes in semiconductor device fabrication.

BACKGROUND OF THE INVENTION

Integrated circuits include various semiconductor devices, such as transistors and capacitors, for example. During the fabrication of such semiconductor devices, particular regions may be implanted with a dopant, or "doped," and annealed to activate the doped regions. For example, during fabrication of a transistor structure, a source, drain and gate poly region may be doped, and the transistor structure may subsequently be placed in a furnace for one or more annealing process, such as a source/drain anneal, in order to activate the source, drain and gate regions. In addition, fabrication may include one or more silicidation processes which may include a silicide annealing process.

However, during these annealing processes, a portion of the dopant may escape or diffuse away from the source, drain and gate regions toward adjacent regions of the transistor structure. Such dopant losses in the source, drain and gate regions of the transistor structure reduce the effectiveness of the resulting transistor, and may even cause the transistor to operate improperly, such as by failing to turn on or off as desired. Compensating for such dopant losses may require an increase in the amount of energy or implant dosage used to implant dopant into the doped regions, which places additional strain on the implanting equipment.

For example, FIG. 1 illustrates an example prior art transistor structure 10 including dopant losses occurring during a source/drain anneal. Transistor structure 10 comprises an active source region 12 and an active drain region 14 formed in a substrate 16, as well as a gate region 18. Substrate 16 may be formed from silicon, gallium arsenide, or any other material suitable to form a transistor substrate.

A gate dielectric layer 30 may be formed partially or completely over or around gate 18. As shown in FIG. 1, gate dielectric 30 may also extend over source region 12 and/or drain region 14. Gate dielectric layer 30 may comprise silicon dioxide or any other material suitable for forming a gate dielectric layer.

Source and drain regions 12 and 14 are formed by implanting one or more dopants through dielectric layer 30 into a first and second region 20 and 22, respectively, of substrate 16 using any suitable known doping method. Dielectric layer 30 may be at least partially or significantly removed or degraded due to various fabrication processes performed prior to the implanting of dopants to form source and drain regions 12 and 14. In some situations, dielectric layer 30 may be completely removed or degraded prior to the dopant being implanted. In such situations, upper portions of first and second regions 20 and 22 may be damaged by the dopant implanting process.

A first and second moderately doped region (MDD) 24 and 26 may also be formed in substrate 16 adjacent source region 12 and drain region 14, respectively. Moderately doped regions 24 and 26 may be formed by implanting a lower concentration of dopant (as compared with source and drain regions 12 and 14) into substrate 16 using any suitable known doping method.

Gate 18 is formed adjacent substrate 16 between source and drain regions 12 and 14. It should be noted that the term "adjacent" as used throughout this document includes immediately adjacent (or contacting), as well as proximate to. Thus, for example, as shown in FIG. 1, gate 18 may be adjacent to substrate 16 with a thin dielectric layer 30 disposed between gate 18 and substrate 16, as discussed below.

Gate 18 may comprise one or more conductive materials suitable for use as a transistor gate, such as titanium, titanium nitride, tungsten, polysilicon, or amorphous silicon. In some embodiments, gate 18 is formed by implanting one or more dopants into a gate poly region 28 of transistor structure 10 using any suitable known doping method. Source and drain regions 12 and 14 and gate 18 may be doped using one or more of the same or different doping processes.

A first deposited oxide layer 32 may be formed adjacent a first side 34 and a second side 36 of gate 18, and may extend over at least a portion of source region 12, drain region 14 and/or moderately doped regions 24 and 26. A nitride layer 38 may be formed adjacent first deposited oxide layer 32 on each of the first and second sides 34 and 36 of gate 18. In addition, a second deposited oxide layer 40 may be formed over nitride layer 38 on each of the first and second sides 34 and 36 of gate 18.

It should be understood that although transistor structure 10 as shown in FIG. 1 includes various layers 30, 32, 38 and 40, in alternative embodiments transistor structure 10 may include any suitable combination of similar and/or different layers.

As discussed above, source and drain regions 12 and 14 are formed by implanting a dopant (or a plurality of dopants) through dielectric layer 30 into first and second regions 20 and 22 of substrate 16. The dopant in source and drain regions 12 is then "activated" in order to define an active source 42 and an active drain 44 of a transistor by performing a source/drain anneal, or heat treatment, on transistor structure 10.

During the source/drain anneal, a portion of the dopant within source region 12, drain region 14 and gate poly region 28 diffuses or escapes into adjacent or surrounding areas. For example, arrows 46 and 48 indicate dopant diffusing from source and drain regions 12 and 14, respectively, through dielectric layer 30 during the source/drain anneal. Similarly, arrows 50 indicate dopant diffusing from gate poly region 28 through dielectric layer 30 during the source/drain anneal.

Dielectric layer 30 may be operable to prevent a portion of, or reduce the amount of, dopant loss from source region 12, drain region 14 and gate poly region 28 during the source/drain anneal, depending on the thickness of dielectric layer 30. However, in conventional and advanced fabrication processes, dielectric layer 30 may be relatively thin (such as less than 20 angstroms, for example) or nonexistent, and therefore unable to prevent a significant amount of the dopant loss from source region 12, drain region 14 and gate poly region 28.

In addition, dielectric layer 30 may vary in thickness across the area of dielectric layer 30, as well as throughout the various steps or sub-processes of the fabrication process, and, as discussed above, may be partially or even completely removed or degraded due to various fabrication processes, all of which may allow relatively large amounts of dopant to diffuse away from all or portions of source region 12, drain region 14 and gate poly region 28 during the source/drain anneal.

At some time subsequent to the source/drain anneal shown in FIG. 1, one or more silicide regions may be formed in transistor structure 10, which formation includes a silicide anneal process, as discussed below regarding FIG. 2.

FIG. 2 illustrates prior art transistor structure 10 including dopant losses occurring during a silicide anneal. After the source/drain anneal (discussed above with reference to FIG. 1) is performed, dielectric layer 30 is removed (assuming that at least a portion of dielectric layer 30 still remains). As shown in FIG. 2, a metal layer (such as a layer of titanium, cobalt, nickel, or platinum, or other suitable metal), or film, 60 is deposited adjacent transistor structure 10, such as by using a sputtering process, for example. Transistor structure 10 is then heated using a thermal cycle, which may include one or more heating processes, during which metal layer 60 reacts with the silicon in active source 42, active drain 44 and gate 18 to form silicide regions 62, 64 and 66 in active source 42, active drain 44 and gate 18, respectively.

During at least a portion of the thermal cycle, which may be referred to as a silicide anneal, a portion of the remaining dopant within active source 42, active drain 44 and gate 18 diffuses or is pulled into silicide regions 62, 64 and 66. For example, arrows 68, 70 and 72 indicate dopant loss from active source 42, active drain 44 and gate 18 into silicide regions 62, 64 and 66, respectively, during the silicide anneal.

Dopant losses occurring during the source/drain anneal (shown in FIG. 1) and silicide anneal (shown in FIG. 2) reduce the effectiveness of the transistor resulting from transistor structure 10, and may even cause the transistor to operate improperly, such as by failing to turn on or off as desired. In order to compensate for such dopant losses, designers may be required to increase the amount of energy or implant dosage used to implant dopant into source region 12, drain region 14 and gate poly region 28, which places additional strain on the implanting equipment.

SUMMARY OF THE INVENTION

In accordance with the present invention, a system and method is provided that reduces or substantially eliminates dopant losses caused by annealing processes used during the fabrication of semiconductor devices, such as transistors.

According to one embodiment, a method of reducing dopant losses is provided. The method includes providing a transistor structure having a first region, implanting a dopant into the first region, depositing a control layer adjacent the first region, and performing a first annealing process on the transistor structure. The control layer is operable to prevent at least a portion of the dopant in the first region from diffusing out of the first region toward the control layer during the first annealing process.

According to another embodiment, an integrated circuit is provided. The integrated circuit includes a transistor comprising a first active region having been formed at least by implanting a dopant into a first region of a transistor structure, depositing a control layer adjacent the first region, and performing a first annealing process on the transistor structure. The control layer is operable to prevent at least a portion of the dopant in the first region from diffusing out of the first region toward the control layer during the first annealing process.

Various embodiments of the present invention may benefit from numerous advantages. It should be noted that one or more embodiments may benefit from some, none, or all of the advantages discussed below.

One advantage is that a cap or control layer may be used to reduce dopant losses occurring during a source/drain anneal performed during the fabrication of a transistor. Such dopant losses may reduce the effectiveness of the transistor and cause the transistor to operate improperly, such as by failing to turn on or off as desired.

Another advantage is that dopant losses occurring during a silicide anneal performed during the fabrication of the transistor may also be reduced. In some embodiments, an anisotropic etch may be used to remove a portion of the control layer while leaving sidewalls remaining on each side of the transistor gate. The sidewalls operate to reduce the area of contact between the gate and a deposited silicide layer, which reduces the size of the silicide region formed in the gate, which in turn reduces the amount of dopant losses occurring during the subsequent silicide anneal.

Other advantages will be readily apparent to one having ordinary skill in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Example embodiments of the present invention and their advantages are best understood by referring now to FIGS. 1 through 6 of the drawings, in which like numerals refer to like parts.

Figure 1:
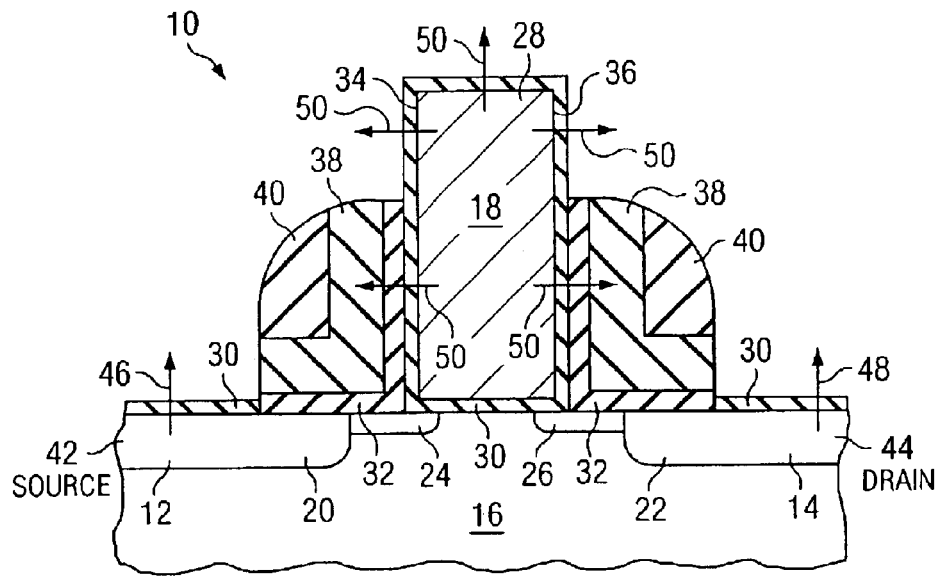
FIG. 1 illustrates a prior art transistor structure including dopant losses occurring during a source/drain anneal.
Figure 2:
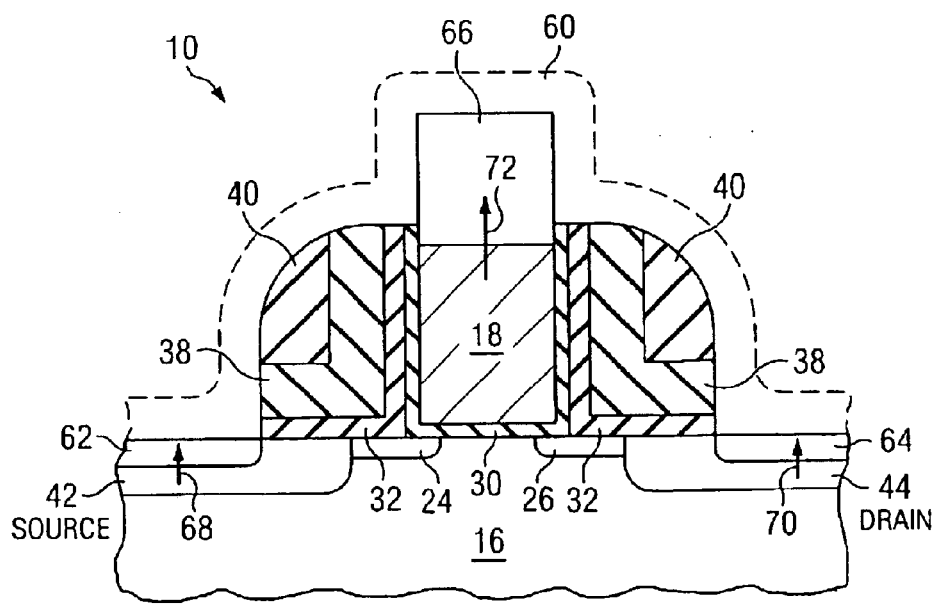
FIG. 2 illustrates a prior art transistor structure including dopant losses occurring during a silicide anneal.
Figure 3:
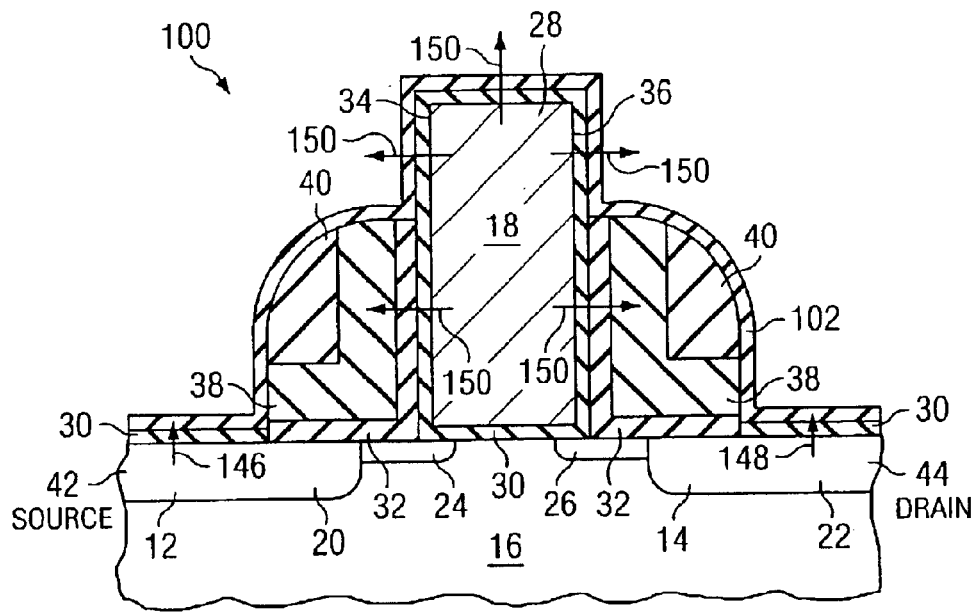
FIG. 3 illustrates a transistor structure including a control layer for reducing dopant losses occurring during a source/drain anneal in accordance with an embodiment of the present invention.

Among other things, various embodiments of the present invention are directed toward reducing dopant losses during transistor fabrication processes. FIG. 3 illustrates a transistor structure 100 including a control layer for reducing dopant losses occurring during a source/drain anneal in accordance with an embodiment of the present invention. Transistor structure 100 is similar to transistor structure 10 shown in FIGS. 1 and 2, and includes source region 12, drain region 14, and gate 18. However, as shown in FIG. 3, a cap or control layer 102 is formed over transistor structure 100 before performing the source/drain anneal. Control layer 102 is generally operable to reduce the amount of dopant loss from source region 12, drain region 14 and gate 18, indicated by arrows 146, 148 and 150, respectively, during the source/drain anneal performed to activate active source 42 and active drain 44.

Control layer 102 may comprise a layer of oxide or any other suitable material or combination of materials operable to prevent or reduce dopant loss during an anneal or heating process. Control layer 102 may be deposited and/or grown, and may be formed over dielectric layer 30, as shown in FIG. 3. As discussed above, dielectric layer 30 may be partially or completely removed or degraded due to various fabrication processes performed. Thus, in a situation in which dielectric layer 30 has been completely removed, control layer 102 may be formed directly adjacent at least some portions of source and drain regions 42 and 44.

Control layer 102 may be relatively thick, at least compared to dielectric layer 30. For example, in some embodiments, control layer 102 has a thickness approximately equal to or greater than 50 angstroms. In a particular embodiment, control layer 102 has a thickness greater than 100 angstroms. The thickness of control layer 102 may be predetermined and selected to achieve a desired maximum level of dopant loss or diffusion, or to prevent a particular amount of dopant loss or diffusion.

Figure 4:
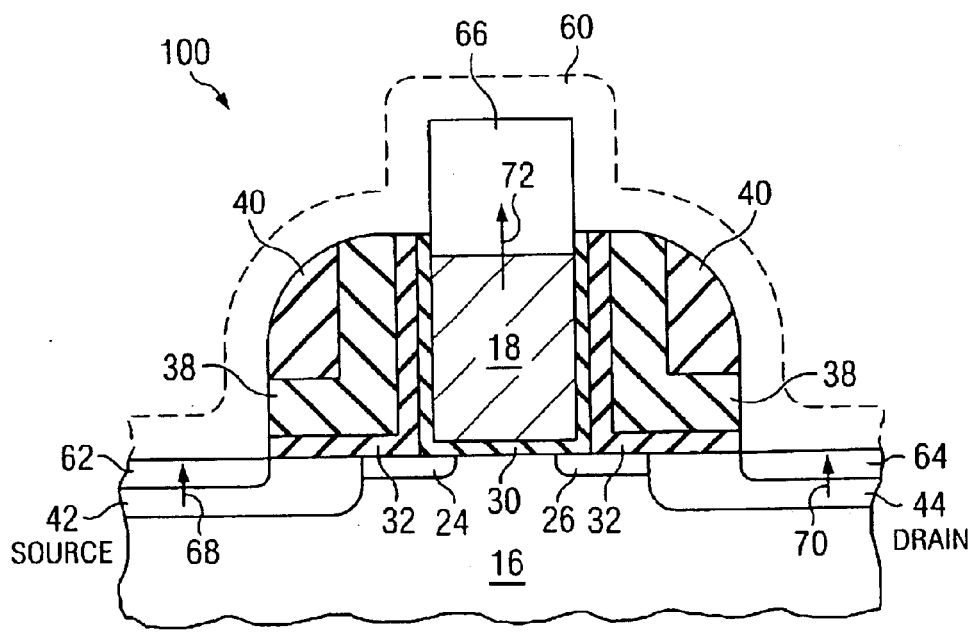
FIG. 4 illustrates the transistor structure of FIG. 3 including dopant losses occurring during a subsequent silicide anneal.

FIG. 4 illustrates transistor structure 100 of FIG. 3 including dopant losses occurring during a subsequent silicide anneal. After the source/drain anneal discussed above with reference to FIG. 3, control layer 102 and dielectric layer 30 are removed using an isotropic etch, such as a wet, or chemical, etch.

A metal layer 60 is deposited adjacent transistor structure 100, such as by using a sputtering process, for example, and transistor structure 100 is then heated using a thermal cycle, or silicide anneal, which may include one or more heating processes.

During the thermal cycle, metal layer 60 reacts with the portions of active source 42, active drain 44 and gate 18 in which metal layer 60 is in direct contact to form source and drain silicide regions 62 and 64, as well as gate silicide region 66, within active source 42, active drain 44 and gate 18, respectively. In addition, during the thermal cycle, a portion of the remaining dopant within active source 42, active drain 44 and gate 18 diffuses or is pulled into silicide regions 62, 64 and 66, as indicated by arrows 68, 70 and 72.

Figure 5:
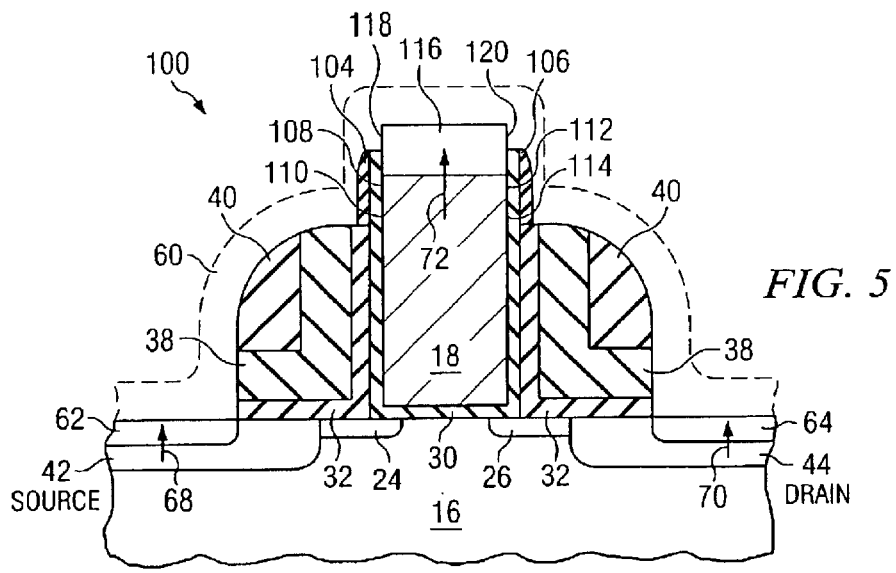
FIG. 5 illustrates the transistor structure of FIG. 3 including residual gate sidewalls for reducing dopant losses occurring during a subsequent silicide anneal in accordance with an embodiment of the present invention.

FIG. 5 illustrates the transistor structure 100 of FIG. 3 including residual sidewalls of control layer 102 for reducing dopant losses occurring during the silicide anneal in accordance with an embodiment of the present invention. FIG. 5 illustrates an alternative embodiment to that shown in FIG. 4. In the embodiment shown in FIG. 4, a control layer 102 is removed using an isotropic etch, as discussed above. In contrast, in the embodiment shown in FIG. 5, a portion of control layer 102 is removed using an anisotropic etch, such as a dry etch, reactive ion etch (RIE), or plasma etch, for example, which leaves a second portion (or portions) of control layer 102 remaining adjacent gate 18, which may be useful for reducing the amount of dopant loss during the thermal cycle, or silicide anneal, performed during a subsequent silicidation process. In the embodiment shown in FIG. 5, the remaining portion of control layer 102 comprises a first sidewall 104 adjacent a first portion 108 of a first surface 110 of gate 18 and a second sidewall 106 adjacent a first portion 112 of a second surface 114 of gate 18.

A metal layer 60 is deposited adjacent transistor structure 100, such as by using a sputtering process, for example, and transistor structure 100 is then heated using a thermal cycle, or silicide anneal, which may include one or more heating processes. During the thermal cycle, metal layer 60 reacts with the portions of active source 42 and active drain 44 in which metal layer 60 is in direct contact to form silicide regions 62 and 64, respectively. In addition, metal layer 60 reacts with the portion of the gate 18 in which metal layer 60 is in direct contact to form gate silicide region 116.

As shown in FIG. 5, metal layer 60 contacts, and thus reacts with, a second portion 118 of first surface 110 of gate 18 and a second portion 120 of second surface 114 of gate 18. However, first and second sidewalls 104 and 106 prevent metal layer 60 from contacting, and thus reacting with, first portion 108 of first surface 110 of gate 18 and first portion 112 of second surface 114 of gate 18. Thus, the depth of gate silicide region 116 shown in the embodiment of FIG. 5 is less than the depth of gate silicide region 66 shown in the embodiment discussed in connection with FIG. 4.

During the thermal cycle, or silicide anneal, a portion of the remaining dopant within active source 42, active drain 44 and gate 18 diffuses or is pulled into silicide regions 62, 64 and 116, as indicated by arrows 68, 70 and 72, respectively. The reduced size of gate silicide region 116 as compared with gate silicide region 66 results in a lower amount of dopant loss (indicated in FIG. 5 by arrow 72) from gate 18 into silicide region 116 during the silicide anneal because this amount of dopant loss is directly related to the size of the gate silicide region. In other words, by using sidewalls 104 and 106 remaining from control layer 102 to reduce the size of gate silicide region 116 formed in gate 18 (as compared with the size of gate silicide region 66), the amount of dopant loss occurring during the silicide anneal is reduced.

Thus, using control layer 102 as shown in FIG. 3, dopant losses during a source/drain anneal may be reduced. In addition, using sidewalls 104 and 106 shown in FIG. 5, dopant losses during a silicide thermal cycle, or silicide anneal, may be reduced.

Figure 6:
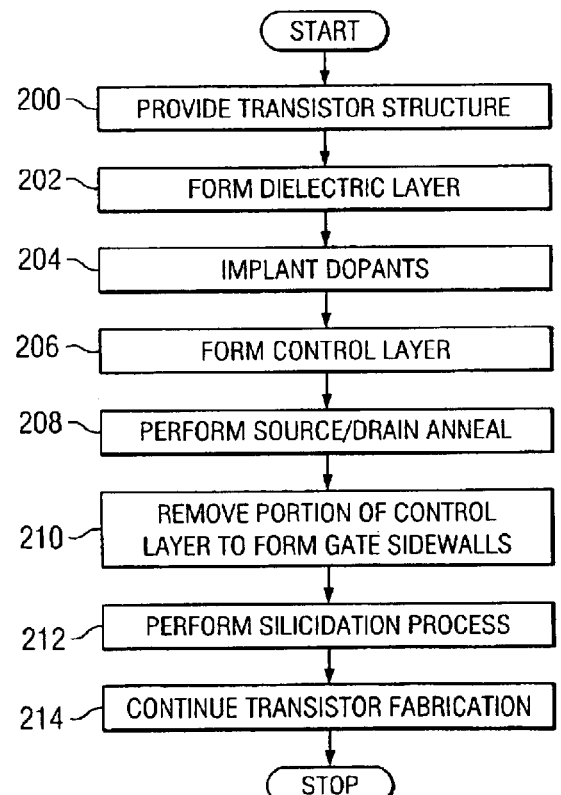
FIG. 6 illustrates a method of reducing dopant losses associated with both a source/drain anneal and a silicide anneal performed during the fabrication of a transistor in accordance with an embodiment of the present invention.

FIG. 6 illustrates a method of reducing dopant losses associated with both a source/drain anneal and a silicide anneal in transistor fabrication in accordance with an embodiment of the present invention. At step 200, a transistor structure 100 is provided. Transistor structure 100 includes a first region 20, a second region 22, and a gate poly region 28.

At step 202, a dielectric layer 30 is formed over transistor structure 100. Dielectric layer 30 may be relatively thin (such as less than 20 angstroms, for example) and may vary in thickness during the various steps in the fabrication process.

At step 204, one or more dopants are implanted through dielectric layer 30 into first region 20, second region 22, and gate poly region 28 to form a source region 12, a drain region 14, and a gate 18. Step 204 may comprise one or more implant processes that may be performed at different times within the fabrication process. As discussed above, in some situations, dielectric layer 30 may partially or completely removed or degraded due to various fabrication processes performed prior to the implanting of dopants at step 204.

At step 206, a control layer 102 is formed over dielectric layer 30 adjacent source region 12, drain region 14, and gate 18. Control layer 102 may be deposited and/or grown over dielectric layer 30 (assuming that at least a portion of dielectric layer 30 still remains). Control layer 102 may comprise a layer of oxide having a thickness greater than that of dielectric layer 30. The thickness of control layer 102 may be selected to prevent a particular amount of dopant loss or diffusion.

In an alternative embodiment, control layer 102 is formed over transistor structure 100 prior to the implanting of dopants at step 204. For example, in a situation in which dielectric layer 30 is partially or completely removed or degraded prior to the implanting of dopants at step 204, control layer 102 may be formed prior to the implanting of dopants at step 204 in order to protect upper portions of transistor structure 100 during the implant processes. The dopants may then be implanted through control layer 102 and any remaining portions of dielectric layer 30 into first region 20, second region 22, and gate poly region 28 to form source region 12, drain region 14, and gate 18, respectively.

At step 208, a source/drain annealing process is performed on the transistor structure 100 in order to activate the dopant in source region 12 and drain region 14 to form active source 42 and active drain 44 for the transistor resulting from transistor structure 100. During the source/drain anneal, an amount of dopant typically escapes or diffuses from source region 12, drain region 14, and gate 18 toward adjacent or surrounding or areas. However, control layer 102 reduces or prevents at least a portion of dopant loss from source region 12, drain region 14, and gate 18, at least in the direction of control layer 102 (as indicated, for example, by arrows 146, 148 and the top three arrows 150 in FIG. 3).

At step 210, a first portion of control layer 102 and dielectric layer 30 is removed using an anisotropic etch, leaving a second portion (or portions) of control layer 102 which form a first sidewall 104 adjacent a first portion 108 of a first surface 110 of gate 18 and a second sidewall 106 adjacent a first portion 112 of a second surface 114 of gate 18, as shown in FIG. 5. A portion of dielectric layer 30 may also remain between each sidewall 104 and 106 and gate 18, as shown in FIG. 5.

At step 212, a metal layer 60 is deposited adjacent transistor structure 100, such as shown in FIG. 5, and transistor structure 100 is heated using a thermal cycle, or silicide anneal. During the thermal cycle, metal layer 60 reacts with the portions of active source 42 and active drain 44 in which metal layer 60 is in direct contact to form silicide regions 62 and 64, respectively. In addition, metal layer 60 reacts with the portion of the gate 18 in which metal layer 60 is in direct contact to form gate silicide region 116. In particular, as shown in FIG. 5, metal layer 60 contacts, and thus reacts with, a second portion 118 of first surface 110 of gate 18 and a second portion 120 of second surface 114 of gate 18 to form gate silicide region 116. However, first and second sidewalls 104 and 106 prevent silicide layer 60 from reacting with first portion 108 of first surface 110 of gate 18 and first portion 112 of second surface 114 of gate 18. Thus, sidewalls 104 and 106 operate to reduce the depth of gate silicide region 116.

During the thermal cycle, or silicide anneal, a portion of the remaining dopant within active source 42, active drain 44 and gate 18 diffuses or is pulled into silicide regions 62, 64 and 116, such as indicated by arrows 68, 70 and 72, respectively, shown in FIG. 5. As discussed above with respect to FIG. 5, the reduced size of gate silicide region 116 due to the use of sidewalls 104 and 106 during the formation of gate silicide region 116 reduces the amount of dopant loss occurring during the silicide anneal. At step 214, the transistor fabrication may continue, which may include one or more various fabrication steps or processes.

Thus, dopant losses during a source/drain anneal may be reduced by using control layer 102, as discussed above with reference to steps 206 and 208. In addition, dopant losses during a silicide thermal cycle, or silicide anneal, may be reduced by using an anisotropic etch to create sidewalls 104 and 106, as discussed above with reference to steps 210 and 212.

Although embodiments of the invention and its advantages have been described in detail, a person skilled in the art could make various alterations, additions, and omissions without departing from the spirit and scope of the present invention as defined by the appended claims.

What is claimed is:

1. A method for reducing dopant losses, comprising:

providing a transistor structure having a first region;

implanting a dopant into the first region of the transistor structure;

forming a control layer adjacent the first region;

performing a first annealing process on the transistor structure;

wherein the control layer is operable to prevent at least a portion of the dopant in the first region from diffusing from the first region toward the control layer during the first annealing process;

removing a first portion of the control layer such that a second portion of the control layer adjacent the first portion of the control layer adjacent a first portion of a first surface of the doped first region remains; and depositing a metal layer adjacent the doped first region and the remaining second portion of the control layer such that the remaining second portion of the control layer prevents the metal layer from contacting the first portion of the first surface of the doped first region.

2. The method of claim 1, wherein the first region comprises a gate poly region.

3. The method of claim 2, wherein the first surface of the doped first region is a side surface of the gate poly region.

4. The method of claim 1, wherein the control layer is formed over a thin oxide layer adjacent the first region.

5. The method of claim 1, further comprising performing a second annealing process on the transistor structure.

6. The method of claim 5, wherein the second annealing process comprises a silicide anneal.

* * * * *